United States Patent [19]

Simpson et al.

[11] Patent Number: 5,314,652
[45] Date of Patent: May 24, 1994

[54] METHOD FOR MAKING FREE-STANDING DIAMOND FILM

[75] Inventors: Matthew Simpson, Arlington; Robert M. Frey, Worcester, both of Mass.

[73] Assignee: Norton Company, Worcester, Mass.

[21] Appl. No.: 973,994

[22] Filed: Nov. 10, 1992

[51] Int. Cl.⁵ .................. B29C 41/42; B29C 41/48; C23C 16/76; C23C 16/50
[52] U.S. Cl. ........................ 264/81; 427/553; 427/577; 427/249; 427/255.7; 264/39; 264/219
[58] Field of Search ............... 427/249, 255, 255.7, 427/577, 553; 264/81, 317, 39, 219

[56] References Cited

U.S. PATENT DOCUMENTS

| | | | |
|---|---|---|---|
| 4,707,384 | 11/1987 | Schachner et al. | 427/249 |
| 4,925,701 | 5/1990 | Jansen et al. | 427/249 |
| 4,987,002 | 1/1991 | Sakamoto et al. | 427/34 |
| 5,114,745 | 5/1992 | Jones | 427/255.2 |
| 5,180,571 | 1/1993 | Hosoya et al. | 156/DIG. 68 |
| 5,183,529 | 2/1993 | Potter et al. | 156/DIG. 68 |
| 5,221,501 | 6/1993 | Feldman et al. | 264/81 |

FOREIGN PATENT DOCUMENTS

| | | |
|---|---|---|
| 0467043A2 | 1/1992 | European Pat. Off. |
| 60-212847 | 10/1985 | Japan . |
| 61-151097 | 7/1986 | Japan . |
| 3-197385 | 8/1991 | Japan . |

Primary Examiner—Shrive Beck
Assistant Examiner—Bret Chen
Attorney, Agent, or Firm—Volker R. Ulbrich; Martin M. Novack

[57] ABSTRACT

A method for making a free-standing synthetic diamond film of desired thickness, including the following steps: providing a substrate; selecting a target thickness of diamond to be produced, the target thickness being in the range 200 microns to 1000 microns; finishing a surface of the substrate to a roughness, $R_A$, that is a function of the target thickness, the roughness being determined from $$0.38t/600 \, \mu m \leq R_A \leq 0.50 \, \mu m \quad 200 \, \mu m < t \leq 600 \, \mu m$$
$$0.38 \, \mu m \leq R_A \leq 0.50 \, \mu m \quad 600 \, \mu m < t < 1000 \, \mu m$$

where t is the target thickness; depositing an interlayer on the substrate, the interlayer having a thickness in the range 1 to 20 microns; depositing synthetic diamond on the interlayer, by chemical vapor deposition, to about the target thickness; and cooling the synthetic diamond to effect the release thereof.

18 Claims, 2 Drawing Sheets

1

METHOD FOR MAKING FREE-STANDING DIAMOND FILM

FIELD OF THE INVENTION

This invention relates to synthetic diamond and, more particularly, to a method of making synthetic diamond film.

BACKGROUND OF THE INVENTION

Diamond has a number of properties which make it attractive for use in various applications. Among these properties are extreme hardness and excellent transmissivity of certain radiation. Diamond is also an extraordinary heat conductor, thermally stable, and an electrical insulator. However, natural diamond is prohibitively expensive for applications which require any substantial size and is difficult to form into certain shapes.

In recent years, a number of techniques have been developed for synthesizing diamond and for depositing synthetic diamond on surfaces of various shapes to obtain a diamond film or coating. These techniques include so-called high-pressure high-temperature ("HPHT") methods and chemical vapor deposition ("CVD") methods. The CVD methods include plasma deposition techniques wherein, for example, plasmas of a hydrocarbon and hydrogen are obtained using electrical arcing. The resultant plasma can be focused and accelerated toward a substrate using focusing and accelerating magnets. Reference can be made, for example, to U.S. Patent Application Serial No. 773,465, assigned to the same assignee as the present Application, for description of an example of a type of plasma jet deposition that can be utilized to deposit synthetic diamond on a substrate.

Synthetic diamond film can be deposited as a permanent coating on a substrate, such as on the wear surface of a tool or as an environmentally protective coating. Such films are generally considered to be relatively thin films. Alternatively, a synthetic diamond film that is generally considered a thick film, can be deposited on a substrate and then removed, preferably intact as a single "free standing" piece, for use in applications such as heat sinks, optical windows, and in tools. However, the obtainment of such thick films, especially of relatively large area, has proven troublesome. In addition to the difficulty of depositing quality synthetic diamond of substantial thickness, there is the problem of removing the diamond intact from the substrate. The substrate material will generally have a different coefficient of expansion than the diamond, as well as a different molecular and chemical structure. The adherence and growth of the diamond film, as well as its release, will depend, inter alia, on the materials used, surface preparation, and deposition parameters.

Titanium nitride and other materials have been used as a coating for a substrate, such as molybdenum, upon which synthetic diamond is to be deposited. Titanium nitride adheres reasonably well to molybdenum. Diamond can be deposited over a thin layer of the titanium nitride and then, ideally, released from the substrate after the desired thickness of synthetic diamond film has been deposited, such as by chemical vapor deposition. The diamond is deposited at a relatively high temperature and, as the diamond (as well as the titanium nitride interlayer and substrate below) cools after completion of the diamond deposition, the diamond should be released from the substrate, preferably in one piece. However, problems have been found to occur in the procedure. One of these problems is premature flaking off of the diamond and/or its underlayer during deposition or premature release of the diamond before deposition is complete. A further problem is cracking of the diamond upon its release from the substrate.

It is among the objects of the present invention to provide a solution to the indicated problems, and to generally improve the fabrication of free-standing synthetic diamond by chemical vapor deposition process.

SUMMARY OF THE INVENTION

Applicant has discovered that for obtainment of relatively thick free standing diamond films having a thickness in the range 200 to 1000 Hm, the roughness of the substrate surface, beneath the thin interlayer upon which the diamond is to be deposited by CVD, should be closely controlled in order to maximize the efficacy of the diamond deposition and release process. In particular, the substrate surface roughness must not only be smooth enough to permit release of the diamond after deposition of a desired diamond thickness is complete, but also rough enough to prevent premature lift-off of the diamond or flaking-off of diamond during the deposition process.

In accordance with an embodiment of the invention, there is set forth a method for making a free-standing synthetic diamond film of desired thickness, comprising the following steps: providing a substrate; selecting a target thickness of diamond to be produced, said target thickness being in the range 200 microns to 1000 microns; finishing a surface of the substrate to a roughness, $R_A$, that is a function of the target thickness, said roughness being determined from $$0.38t/600 \ \mu m \leq R_A \leq 0.50 \ \mu m \quad 200 \ \mu m < t \leq 600 \ \mu m$$
$$0.38 \ \mu m \leq R_A \leq 0.50 \ \mu m \quad 600 \ \mu m < t < 1000 \ \mu m$$

where t is the target thickness; depositing an interlayer on the substrate, the interlayer having a thickness in the range 1 to 20 microns; depositing synthetic diamond on said interlayer, by chemical vapor deposition, to about the target thickness; and cooling the synthetic diamond to effect the release thereof.

In a disclosed embodiment hereof, the step of providing a substrate comprises providing a molybdenum substrate, and said step of depositing an interlayer comprises depositing a layer of titanium nitride. In this embodiment, step of depositing an interlayer also preferably comprises depositing an interlayer having a thickness in the range 3 to 5 microns.

As seen from the above indicated relationship between target diamond thickness and surface roughness, for target thicknesses between 200 and 600 Hm the minimum acceptable surface roughness increases with increasing target diamond thickness. This results in reducing instances of the types of failure that were first described above.

Further features and advantages of the invention will become more readily apparent from the following detailed description when taken in conjunction with the accompanying drawings.

DETAILED DESCRIPTION

Figure 1:
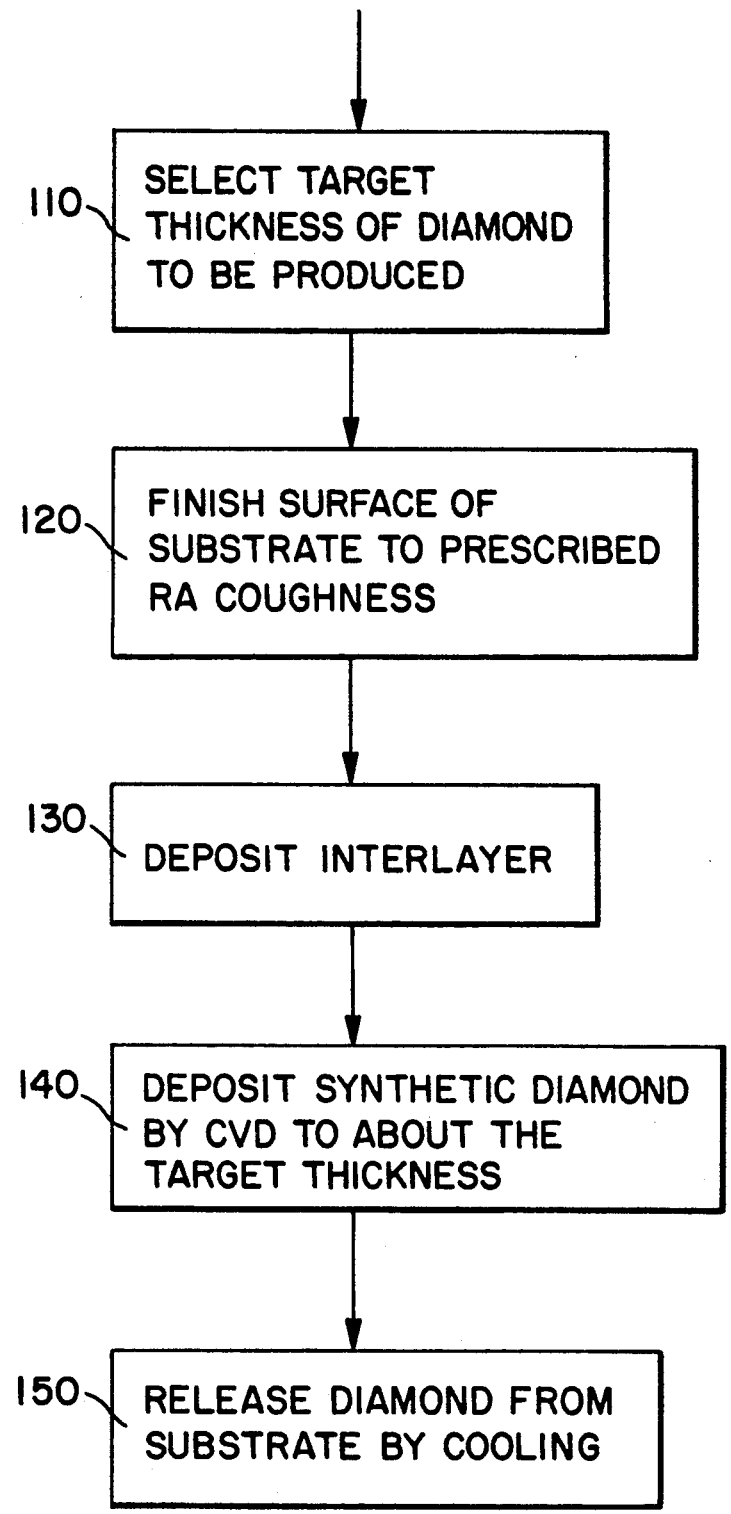
FIG. 1 is an operational flow diagram of the steps of an embodiment of the method of the invention.

Referring to FIG. 1, there is shown an operational flow diagram of the steps of a procedure for obtaining free-standing synthetic diamond film of a desired thickness in accordance with an embodiment of the invention. The block 110 represents selection of the target thickness of diamond to be obtained, the invention being directed to a target diamond thickness in the range 200 to 1000 microns. The surface of the substrate to be used for diamond deposition is then finished to a prescribed roughness, (block 120). The substrate should have a coefficient of thermal expansion relatively close (preferably within $10^{-5}/°$ K.) to that of diamond, and should be a reasonably good thermal conductor. The preferred substrates hereof are molybdenum, tungsten, and graphite. Molybdenum (including its alloys such as TZM, which contains relatively small percentages of titanium and zirconium) is presently considered particularly preferred. The surface of the substrate is finished to a roughness, $R_A$ [$R_A$ being the universally recognized international parameter of roughness, which is the arithmetic mean of the departure of the surface profile from the mean line], as a function of the target diamond thickness, the roughness being determined from $$0.38t/600 \ \mu m \leq R_A \leq 0.50 \ \mu m \quad 200 \ \mu m < t \leq 600 \ \mu m$$
$$0.38 \ \mu m \leq R_A \leq 0.50 \ \mu m \quad 600 \ \mu m < t < 1000 \ \mu m$$

where t is the target thickness.

A relatively thin interlayer, preferably in the range 1 to 20 microns, is then deposited on the finished substrate surface (block 130), such as by physical vapor deposition ("PVD"). The interlayer, which may if desired comprise several sublayers, should not bond strongly to diamond. A strong chemical bond will promote adhesion and ultimately prevent removal of the diamond from the substrate in one piece. The layer should be thick enough to prevent chemical bonding of the diamond to the underlying substrate, and thin enough to maintain the necessary degree of roughness of the coated substrate surface to permit a degree of mechanical bonding that deters premature release. For titanium nitride, a preferred interlayer hereof, the layer will have a thickness in the range about 3 to 5 microns. Examples of other interlayer materials that can be utilized herein are titanium carbide, hafnium nitride, zirconium nitride, aluminum nitride, and aluminum oxide. Mixtures and compounds of these materials can also be utilized.

Figure 2:
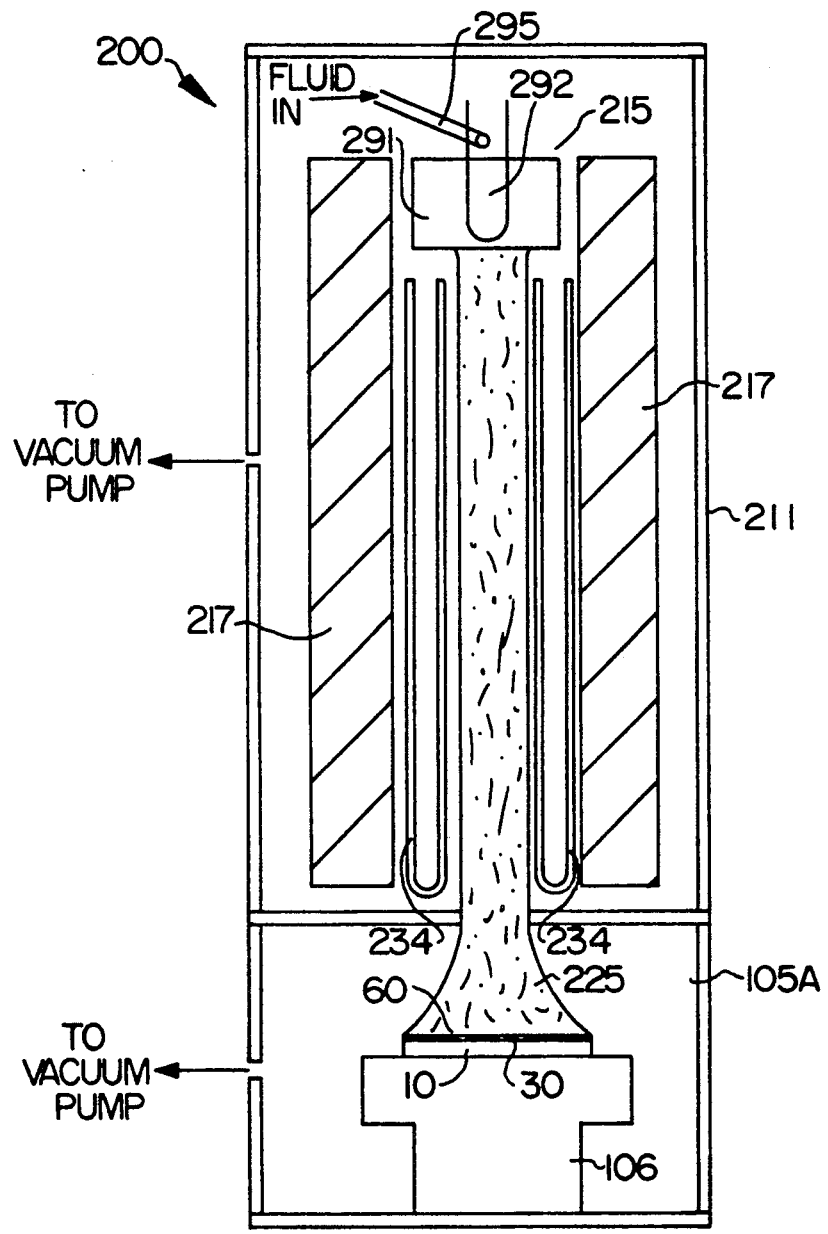
FIG. 2 is a schematic diagram of a plasma jet deposition system which can be utilized for CVD deposition of synthetic diamond for use in an embodiment of the invention.

Synthetic diamond is then deposited, by chemical vapor deposition, to about the target thickness, as represented by the block 140. As used herein, deposition to about the target thickness means deposition to within plus or minus ten percent of the target thickness. The description below, in conjunction with FIG. 2, illustrates a technique of CVD plasma jet deposition, but other techniques of CVD synthetic diamond deposition can be employed. It can be noted that the invention is particularly applicable to techniques of CVD synthetic diamond deposition, such as plasma jet deposition, wherein the diamond is deposited at a relatively high temperature and subject to substantial stresses during the deposition and removal processes. After the target thickness is reached, the synthetic diamond layer can be released from the substrate by cooling, as represented by the block 150. Release is largely due to mechanical stresses upon cooling, and occurs between about 800 and 400 degrees C. A jet of nitrogen gas can be directed at the edge of the diamond to assist the release. In general, when the diamond is released most of the interlayer will remain with the substrate, and any of the interlayer that is on the diamond can be removed chemically, such as by selective etching. If the remaining substrate and interlayer are in sufficiently good condition, they can be used again a number of times for diamond deposition. When necessary, the substrate surface can be refinished and recoated with an interlayer as previously described.

It will be understood that, if desired, the steps of finishing the surface of the substrate (block 120) and/or of depositing the interlayer (block 130) can be performed beforehand, to obtain a supply of substrates and/or coated substrates from which to choose after the target thickness is selected. This sequence of steps is equivalent to performing the finishing and coating of the surface after the target thickness is selected.

Referring to FIG. 2, there is shown a diagram of a plasma jet deposition system 200 of a type which can be utilized in practicing an embodiment of the invention. The system 200 is contained within a vacuum housing 211 and includes an arc-forming section 215 which comprises a cylindrical anode 291, a rod-like cathode 292, and an injector 295 mounted adjacent the cathode so as to permit injected fluid to pass over the cathode 292. In the illustrated system the input fluid may be a mixture of hydrogen and methane. The anode 291 and cathode 292 are energized by a source of electric potential (not shown), for example a DC potential. Cylindrical magnets, designated by reference numeral 217, are utilized to control the plasma generated at the arc forming section. The magnets maintain the plasma within a narrow column until the plasma reaches the deposition region 60. Cooling coils 234, in which liquid nitrogen can be circulated, are located within the magnets and surround the focused plasma.

In operation, a mixture of hydrogen and methane is fed to the injector 295, and a plasma is obtained in front of the arc forming section and accelerated and focused toward the deposition region. The temperature and pressure at the plasma formation region are typically in the approximate ranges 1500–15,000 degrees C and 100–700 torr, respectively, and in the deposition region are in the approximate ranges 800–1100 degrees C and 0.1–200 torr, respectively. As is known in the art, synthetic polycrystalline diamond can be formed from the described plasma, as the carbon in the methane is selectively deposited as diamond, and the graphite which forms is dissipated by combination with the hydrogen facilitating gas.

The bottom portion 105A of the chamber has a base 106 on which can be mounted the substrate 10 with the titanium nitride layer 30 on which the synthetic diamond is to be deposited. The base can include a temperature controller.

EXAMPLES

A number of samples (about forty) of synthetic diamond film, with thicknesses in the approximate range 200 to 1000 microns, were deposited using CVD plasma jet deposition equipment of the type described in conjunction with FIG. 2. The substrates used were molybdenum discs of about 6 inch diameter. Some of the samples were prepared on 3 inch diameter round mesas on the 6 inch discs. The substrate surfaces were lapped with a slurry of diamond or boron carbide grit to a roughness, $R_A$, ranging from about 0.33 microns to about 0.51 microns. After coating by PVD with a titanium nitride interlayer of thickness in the range 3 to 5 microns, equipment of the general type shown in FIG. 2 was used to deposit synthetic diamond in diameters of about 3 to 4 inches, and at thicknesses in the approximate range 200 to 1000 microns. The temperatures at which the diamond released (if no premature lift-off) were in the range about 800 to 400 degrees C. Samples having intended thicknesses of above about 600 Mm, where the $R_A$ roughness was less than 0.38, had a higher incidence of premature lift-off, and samples where the $R_A$ roughness was greater than 0.50 had a higher incidence of cracking upon release. For thicknesses less than about 600 Mm, the minimum roughness needed to prevent premature release was observed to vary approximately linearly with thickness as 0.38 t/600 Mm. Further samples were made in the same manner, but with the substrate first polished to $R_A<0.1$ Mm. Deposited diamond spalled off before its thickness reached 75 Mm.

We claim:

1. A method for making a free-standing synthetic diamond film of a target thickness, comprising the steps of:
   providing a substrate;
   selecting a target thickness of diamond to be produced, said target thickness being in the range 200 microns to 1000 microns;
   finishing a surface of the substrate to a roughness, $R_A$, that is a function of the target thickness, said roughness being determined from $$0.38t/600 \ \mu m \leq R_A \leq 0.50 \ \mu m \quad 200 \ \mu m < t \leq 600 \ \mu m$$
   $$0.38 \ \mu m \leq R_A \leq 0.50 \ \mu m \quad 600 \ \mu m < t < 1000 \ \mu m$$

where t is the target thickness;
   depositing an interlayer on said substrate, the interlayer having a thickness in the range from 1 to 20 microns;
   depositing synthetic diamond on said interlayer, by chemical vapor deposition, to about the target thickness; and
   cooling said synthetic diamond to effect the release thereof.

2. The method as defined by claim 1, wherein said step of providing a substrate comprises providing a substrate of a material selected from the group consisting of molybdenum, tungsten, and graphite.

3. The method as defined by claim 1, wherein said step of depositing an interlayer comprises depositing a material selected from the group consisting of titanium nitride, titanium carbide, hafnium nitride, zirconium nitride, aluminum nitride, and aluminum oxide.

4. The method as defined by claim 2, wherein said step of depositing an interlayer comprises depositing a material selected from the group consisting of titanium nitride, titanium carbide, hafnium nitride, zirconium nitride, aluminum nitride, and aluminum oxide.

5. The method as defined by claim 1, wherein said step of providing a substrate comprises providing a molybdenum substrate.

6. The method as defined by claim 3, wherein said step of providing a substrate comprises providing a molybdenum substrate.

7. The method as defined by claim 5, wherein said step of depositing an interlayer comprises depositing a layer of titanium nitride.

8. The method as defined by claim 1, wherein said step of depositing an interlayer comprises depositing an interlayer having a thickness in the range from 3 to 5 microns.

9. The method as defined by claim 4, wherein said step of depositing an interlayer comprises depositing an interlayer having a thickness in the range from 3 to 5 microns.

10. The method as defined by claim 5, wherein said step of depositing an interlayer comprises depositing an interlayer having a thickness in the range from 3 to 5 microns.

11. The method as defined by claim 6, wherein said step of depositing an interlayer comprises depositing an interlayer having a thickness in the range from 3 to 5 microns.

12. The method as defined by claim 7, wherein said step of depositing an interlayer comprises depositing an interlayer having a thickness in the range from 3 to 5 microns.

13. The method as defined by claim 1, wherein said step of depositing synthetic diamond on said interlayer comprises depositing synthetic diamond by plasma jet chemical vapor deposition.

14. The method as defined by claim 4, wherein said step of depositing synthetic diamond on said interlayer comprises depositing synthetic diamond by plasma jet chemical vapor deposition.

15. The method as defined by claim 5, wherein said step of depositing synthetic diamond on said interlayer comprises depositing synthetic diamond by plasma jet chemical vapor deposition.

16. The method as defined by claim 6, wherein said step of depositing synthetic diamond on said interlayer comprises depositing synthetic diamond by plasma jet chemical vapor deposition.

17. The method as defined by claim 7, wherein said step of depositing synthetic diamond on said interlayer comprises depositing synthetic diamond by plasma jet chemical vapor deposition.

18. The method as defined by claim 8, wherein said step of depositing synthetic diamond on said interlayer comprises depositing synthetic diamond by plasma jet chemical vapor deposition.

* * * * *